United States Patent [19]

Inden et al.

[11] Patent Number: 5,474,108
[45] Date of Patent: Dec. 12, 1995

[54] ELECTROMAGNETIC VALVE UNIT

[75] Inventors: Masahiro Inden, Toyoake; Tomohiko Funahashi, Kariya; Takeshi Marutani, Anjo, all of Japan

[73] Assignee: Aisin Seiki Kabushiki Kaisha, Kariya, Japan

[21] Appl. No.: 400,965

[22] Filed: Mar. 8, 1995

[30] Foreign Application Priority Data

Mar. 10, 1994 [JP] Japan .................................. 6-067725

[51] Int. Cl.[6] ................................................ F16K 11/00
[52] U.S. Cl. ................................. 137/884; 137/270
[58] Field of Search ................................. 137/269, 270, 137/884

[56] References Cited

U.S. PATENT DOCUMENTS 4,785,848 11/1988 Leiber .................................. 137/884 X
5,222,524 6/1993 Sebler et al. .............................. 137/884

FOREIGN PATENT DOCUMENTS 1-199075 8/1989 Japan .

*Primary Examiner*—John C. Fox
*Attorney, Agent, or Firm*—Burns, Doane, Swecker & Mathis

[57] ABSTRACT

The invention is directed to an electromagnetic valve unit which comprises a valve body, on which a plurality of electromagnetic valves mounted in parallel with one another, with the terminals of the valves exposed. A frame, which has a connector portion with through holes defined therein, is secured to the valve body for enclosing the electromagnetic valves. A conductive member is integrally formed with connector terminals and contact pins which are connected with respective terminals of the electromagnetic valves. A cover is provided for covering the conductive member. The connector terminals of the conductive member are pressed into through holes which are defined in the connector portion of the frame, and the contact pins of the conductive member are electrically connected with the respective terminals of the electromagnetic valves.

11 Claims, 3 Drawing Sheets

ELECTROMAGNETIC VALVE UNIT

BACKGROUND OF THE INVENTION

1. Field of the Invention

The present invention relates generally to an electromagnetic valve unit, and more particularly to the electromagnetic valve unit which is applicable to a hydraulic pressure control apparatus of an automobile.

2. Description of the Prior Art

In a conventional hydraulic pressure control apparatus of an automobile, such as an anti-skid control apparatus for example, electromagnetic valves have been employed for controlling the hydraulic pressure. For instance, it has been proposed to employ an electromagnetic valve unit, in which a plurality of electromagnetic valves are divided into a portion for controlling the hydraulic pressure and a solenoid coil portion. Accordingly, solenoid coils of the electromagnetic valves can be electrically connected at a time.

As for the electromagnetic valve unit provided for the hydraulic pressure control apparatus, a valve unit has been proposed in Japanese Patent Laid-open publication No. 1-199075 for example, to utilize a printed circuit board, as shown in FIG. 4, wherein the reference numerals in the parentheses are the same as those used in the publication. According to the valve unit disclosed in the publication, in order to simplify a process for mounting a cap (16) on a valve unit (1), there is provided as one unit, a printed circuit board (14) which is capable of being mounted on every electric contacts (10, 11) of coils (6, 7) and which has a wiring pattern for electrically connecting coils (6, 7) with an external cable (28), and contact means (21) commonly wired with all the contacts of the wiring pattern, and that a plug contact (31) detachable with the cable (28) is fitted into the printed circuit board (14) to form a portion of the common contact means (21). In this electromagnetic valve unit, a plug connector (29) is fixed to the cap (16), so that the plug contact (31) is connected with the printed circuit board (14).

However, according to the valve unit described in the above publication, the printed circuit board has been employed, so that it is still expensive, and it is necessary to connect the connector terminal with the board, and a large number of parts are required. Especially, once the wiring pattern was set, it would not be easy to change the wiring connection. For instance, when a common valve unit is installed on hydraulic pressure control apparatuses of various styles, it is possible to apply its electromagnetic valve portion commonly, but it is necessary in most cases to modify its wiring portion, with its connector terminals arranged inversely at the right and left positions, for example. Therefore, the wiring pattern has to be changed in the valve unit described above, so that a new printed circuit board will have to be made.

As for the one having the connector terminal which has been built in a plastic outer frame member by insert molding for example, when it becomes necessary to provide the connector terminal positioned inversely, a new molding die for the outer frame member has to be made, so that its manufacturing cost will be extremely high. Furthermore, since the metallic connector terminal is molded in the plastic outer frame member, they can not be separated from each other when they are to be disposed, and therefore recycling of waste will be difficult in this case.

SUMMARY OF THE INVENTION

Accordingly, it is an object of the present invention to provide an electromagnetic valve unit which is applicable to a hydraulic pressure control valve, with as small number of parts as possible, and especially provided with a connector portion easily assembled to improve a productivity.

It is another object of the present invention to provide an electromagnetic valve unit which is applicable to a hydraulic pressure control valve, and provided with a metallic connector terminal and a plastic portion which can be easily separated from each other.

In accomplishing these and other objects, a plurality of electromagnetic valves are mounted on a valve body with their terminals exposed, and a frame is secured so as to enclose those electromagnetic valves. The frame has a connector portion with through holes defined therein. A conductive member having connector terminals and contact pins integrally formed therewith is arranged on the frame, so that the connector terminals are pressed into the through holes of the frame. Then, the contact pins are electrically connected to the respective terminals of the electromagnetic valves. And, a cover is secured to the frame to cover the conductive member. Thus, without incorporating the connector terminals by insert molding, the connector terminals are easily provided, so that an appropriate productivity is obtained and its production is easily automated. Also, since the conductive member is only pressed into the frame, it can be separated from the frame easily.

Preferably, the conductive member may be divided into a plurality of layers stacked one over another with insulating members disposed between the layers respectively, to form a bus bar assembly. Consequently, the bus bar assembly can be mounted on the frame, or separated therefrom, by such a simple operation as pressing the connector terminals into the through holes, or pulling the former out of the latter, to thereby obtain an appropriate recycle of waste.

It is preferable to arrange a plurality of electromagnetic valves symmetrically with respect to the central axis of the plane between the valve body and the frame. Therefore, if the connector portion of the frame is arranged inversely at its left and right positions, the connector terminals are provided inversely at its left and right positions, and the bus bar assembly is provided with its wiring slightly modified, then the connector can be provided easily at either side of left and right sides of the electromagnetic valve unit.

It is preferable to cover the bus bar assembly by the cover which is provided at the inner surface with a projection for pressing the bus bar assembly toward the frame to hold the assembly between the cover and said frame.

BRIEF DESCRIPTION OF THE DRAWINGS

The above stated objects and following description will become readily apparent with reference to the accompanying drawings, wherein like reference numerals denote like elements, and in which.

DESCRIPTION OF THE PREFERRED EMBODIMENT

Figure 1:
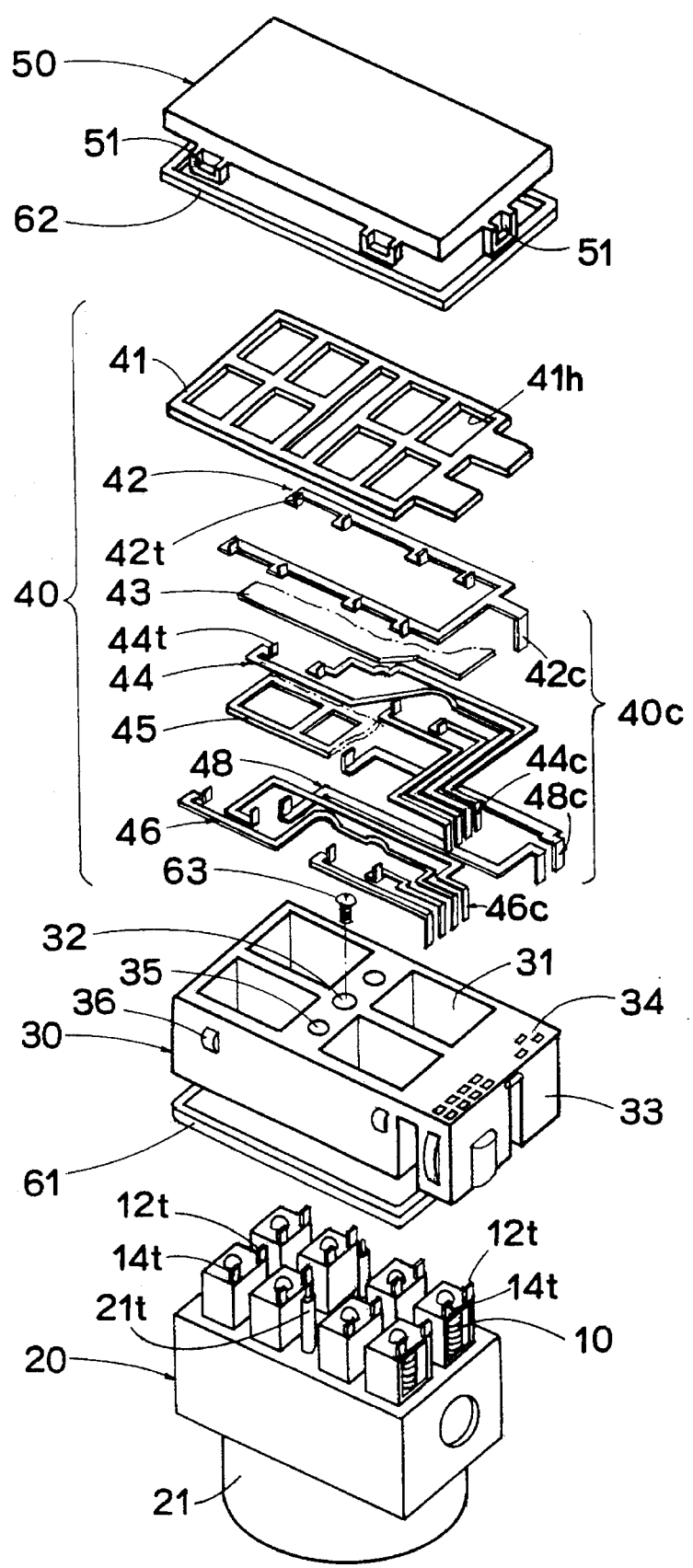
FIG. 1 is a perspective view of an electromagnetic valve unit in its disassembled state according to a first embodiment of the present invention.
Figure 2:
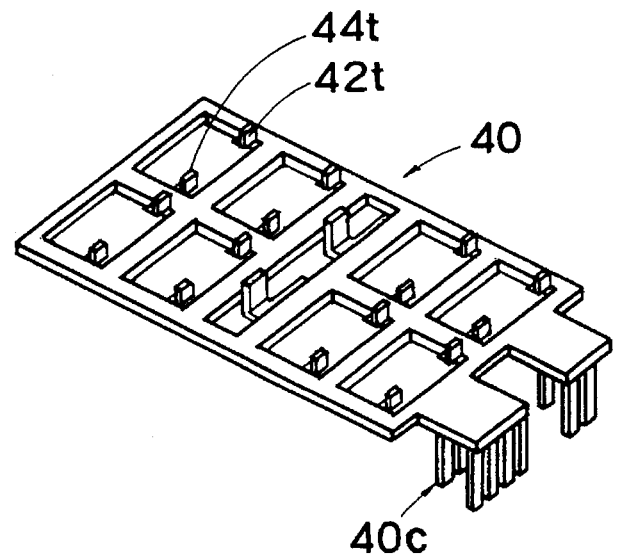
FIG. 2 is a perspective view showing a bus bar in its assembled state in an electromagnetic valve unit according to a first embodiment of the present invention.
Figure 3:
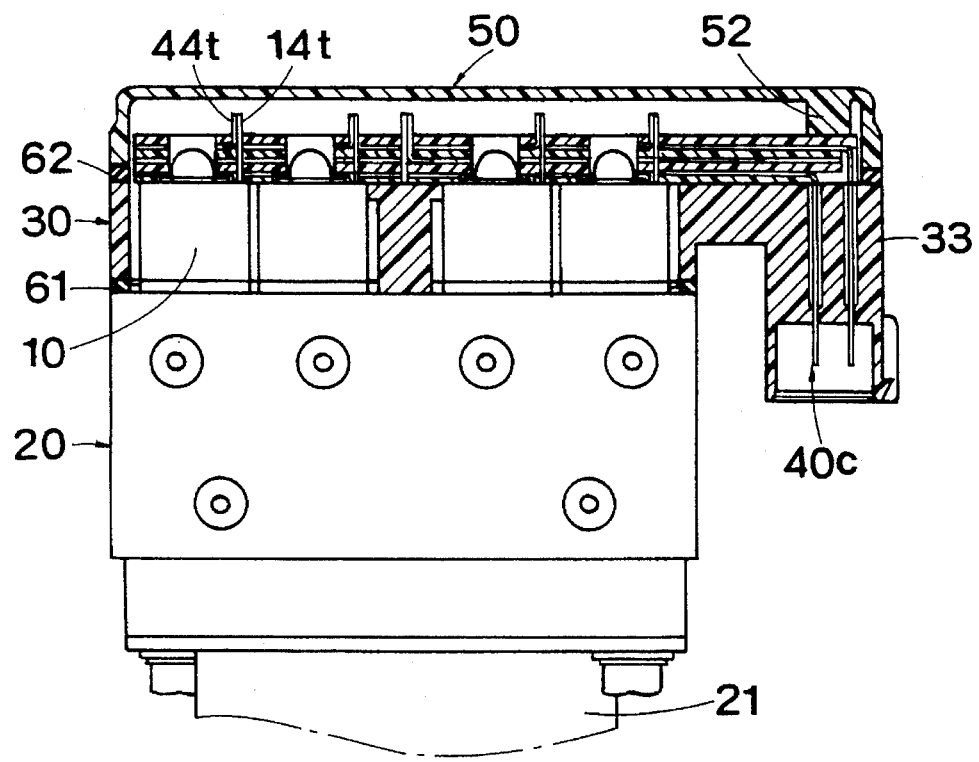
FIG. 3 is a vertical sectional view of an electromagnetic valve unit according to a first embodiment of the present invention.
Figure 4:
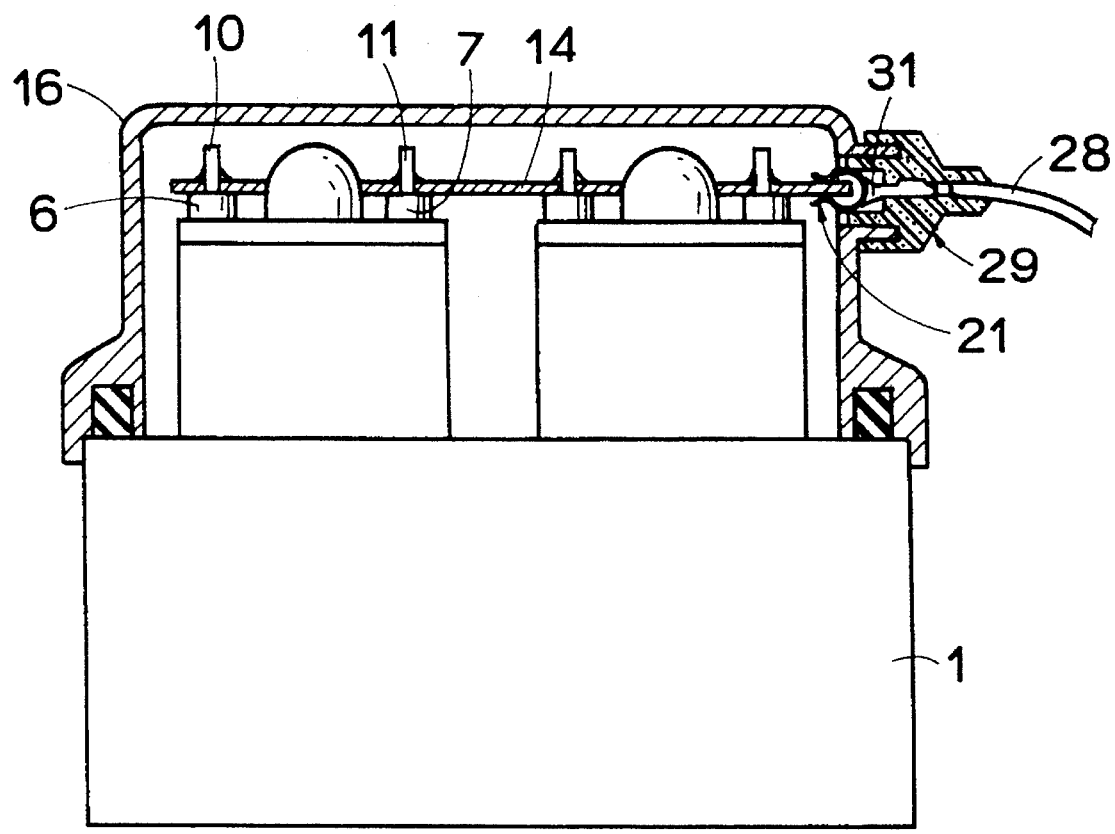
FIG. 4 is a vertical sectional view of a prior valve unit.

Referring to the drawings, there is shown in FIGS. 1, 2 and 3, an embodiment of an electromagnetic valve unit of the present invention, which is provided for a hydraulic pressure control apparatus (not shown) for use in an anti-skid control system of an automobile. The hydraulic pressure control apparatus includes a rectangular valve body 20 which receives a plurality of (for example, eight) electromagnetic valves (represented by 10), a motor 21 which is assembled into the valve body 20 to form an integral part thereof, a frame 30 which encloses the electromagnetic valves 10 and which is secured to the valve body 20 with a packing 61 disposed therebetween, a bus bar assembly 40 which is mounted on the frame 30 to electrically connect with the electromagnetic valves 10, and a cover 50 which is secured to the frame 30 with a packing 62 disposed therebetween.

Each electromagnetic valve 10 is a two-position solenoid operated valve for example, a valve portion of which is accommodated in a plastic housing of the valve body 20, and a solenoid coil portion of which is exposed, i.e., extended out of the upper surface of the valve body 20 as shown in FIG. 1. Each electromagnetic valve 10 is provided with terminals 12t, 14t, and provided with a pair of terminals (represented by 21t) of the motor 21 at its central portion.

The frame 30 is made of synthetic resin to define four rooms (represented by 31) for receiving therein separately every two electromagnetic valves 10, and define a hole 32 for receiving an installation screw 63 in its central portion, and a pair of holes (represented by 35) for receiving the terminals 21t of the motor 21 at its both sides. The frame 30 has a connector portion 33 integrally formed therewith, which extends in a longitudinal direction of the frame 30 out of the plane connected with the valve body 20, and a plurality of through holes (represented by 34) are defined perpendicularly to the connected plane. In this embodiment, the frame 30 is so arranged that the frame 30 is secured to the valve body 20 by screwing the screw 63 into an installation hole (not appeared in FIG. 1) of the valve body 20 through the hole 32. Therefore, the valve body 20 and the frame 30 are connected with each other without any screws exposed on their outer surfaces. In lieu of the screw 63, may be employed other securing member such as a bolt, nut or the like.

The bus bar assembly 40 includes insulating members 41, 43, 45 in various shapes as shown in FIG. 1, conductive members 42, 44, and conductive members 46, 48. The conductive members 42, 44, 46, 48, which are arranged to form three layers (46 and 48 are positioned in the same layer), and the insulating members 41, 43, 45 are alternately stacked one over another, and fixed therebetween through a mechanical engagement. Or, those members may be connected with each other by an easily separable adherent material. Accordingly, a sub-assembly is formed to provide the bus bar assembly 40 as shown in FIG. 2. The conductive member 42 or the like is formed by a copper plate for example, in various shapes as shown in FIG. 1. Each numeral of 44, 46 and 48 represents a plurality of members as shown in FIG. 1.

On each of the conductive members 42 and 44, are elevated a plurality of contact pins (represented by 42t and 44t respectively), and bent to provide connector terminals 42c and 44c extending in a downward direction in FIG. 1 respectively. Also, the contact pins (reference numerals omitted) are elevated on each of the conductive members 46, 48, and the connector terminals 46c, 48c are provided. In FIG. 1, a connector terminal 40c represents all the connector terminals 42c, 44c, 46c and 48c. A plurality of openings 41h are defined in the insulating member 41 to communicate with rooms (represented by 31) which are defined in the frame 30. Accordingly, when the insulating member 41 and the like are connected with the conductive member 42 and the like, the contact pin 42t and the like are extended out of the outer surface of the insulating member 41 through the openings 41h as shown in FIG. 2, while the connector terminal 40c extends downward as shown in FIG. 2.

The cover 50 is made of synthetic resin to be fitted with the configuration of the frame 30, and provided on its outer side surface with a plurality of engaging portions (represented by 51) which engage with protrusions 36 formed on the outer side surface of the frame 30. Also, the cover 50 has a projection 52 which extends from its inner bottom toward its open end as shown in FIG. 3. When the cover 50 is secured to the frame 30 with the bus bar assembly 40 held therebetween, the connector portion 33 is pressed by the projection 52 toward the frame 30. The configuration of the projection 52 is not limited to the one having the cross section as shown in FIG. 3, but may be the one to provide a biasing force against the bus bar assembly 40 when it is pressed between the cover 50 and the bus bar assembly 40, e.g., the one bent at its intermediate portion.

For assembling the above-described parts, at the outset, the frame 30 is mounted on the top surface of the valve body 20 with the packing 61 disposed therebetween as shown in FIG. 1, and secured to the valve body 20 by the screw 63. Then, the connector terminal 40c of the bus bar assembly 40, which constitutes a sub-assembly as shown in FIG. 2 to the electromagnetic valve unit, is pressed into the through holes 34 of the connector portion 33 to form a connector as shown in FIG. 3. Consequently, a side surface of the contact pin 44t of the conductive member 44, for example, contacts with a side surface of the terminal 14t of one of the electromagnetic valves 10, and then the contact pin 44t and the terminal 14t are electrically connected with each other by welding, for example. These may be connected by soldering. Then, the cover 50 is placed on the bus bar assembly 40 with the packing 62 disposed therebetween, and the engaging portions 51 of the cover 50 are engaged with the protrusions 36 of the frame 30, so that the cover 50 is connected with the frame 30 to form the electromagnetic valve unit.

As described above, according to the present embodiment, the bus bar assembly 40 can be fixed by simply pressing the terminals constituting the connector terminal 40c into the through holes 34 of the frame 30, and the contact pin 42t and the like can be easily formed. Since the bus bar assembly 40 can be easily separated from the frame 30, it is easily adapted for recycling of waste. Moreover, if the components of the bus bar assembly 40 are formed to be separable, its recycling ability will be improved.

Furthermore, according to the present embodiment, the electromagnetic valves 10 are disposed symmetrically with respect to the central axis of the connected plane between the valve body 20 and the frame 30. Therefore, when it becomes necessary to provide the connector portion 33 at the left side in FIG. 1, for example, only such a small modification will be sufficient that the frame 30 is disposed with its left and right sides positioned inversely, and that the bus bar assembly 40 is provided with its wiring pattern slightly modified. That is, only the positions of the contact pin 42t etc. formed on the conductive member 42, 44, 46, 48 of the bus bar assembly 40 may be changed to provide the slightly changed wiring pattern. Consequently, without such a large modification as a design change of a printed circuit board, the connector can be easily provided at either side of the electromagnetic valve unit.

It should be apparent to one skilled in the art that the above-described embodiment is merely illustrative of but one of the many possible specific embodiments of the present invention. Numerous and various other arrangements can be readily devised by those skilled in the art without departing from the spirit and scope of the invention

What is claimed is:

1. An electromagnetic valve unit comprising:

a valve body for mounting a plurality of electromagnetic valves in parallel with one another, said electromagnetic valves having terminals thereof exposed;

a frame secured to said valve body for enclosing said electromagnetic valves, said frame having a connector portion with through holes defined therein;

a conductive member having connector terminals and contact pins integrally formed therewith, said connector terminals being pressed into the through holes defined in the connector portion of said frame, and said contact pins being electrically connected with the respective terminals of said electromagnetic valves; and a cover secured to said frame for covering said conductive member.

2. An electromagnetic valve unit as claimed in claim 1, wherein said conductive member is divided into a plurality of layers stacked one over another with insulating members disposed therebetween to form a bus bar assembly, and wherein said connector terminals forming an integral part of said bus bar assembly are pressed into the through holes defined in the connector portion of said frame.

3. An electromagnetic valve unit as claimed in claim 2, wherein said electromagnetic valves are arranged symmetrically with respect to the central axis of the plane between said valve body and said frame.

4. An electromagnetic valve unit as claimed in claim 2, wherein said cover is provided at the inner surface thereof with a projection for pressing said bus bar assembly toward said frame to hold said bus bar assembly between said cover and said frame.

5. An electromagnetic valve unit as claimed in claim 4, wherein said projection has a cross section for providing a biasing force against said bus bar assembly when said projection is pressed between said cover and said bus bar assembly.

6. An electromagnetic valve unit as claimed in claim 2, wherein said insulating members have openings defined therein, and wherein said contact pins are elevated from the plane of said conductive member and extended out of said openings of said insulating members when said layers and said insulating members are stacked.

7. An electromagnetic valve unit as claimed in claim 6, wherein said layers of said conductive member and said insulating members are connected by engaging said contact pins with said openings of said insulating members.

8. An electromagnetic valve unit as claimed in claim 6, wherein said layers of said conductive member and said insulating members are connected with a separable adhering material disposed therebetween.

9. An electromagnetic valve unit as claimed in claim 1, further comprising a first packing disposed between said cover and said frame, and a second packing disposed between said frame and said valve body.

10. An electromagnetic valve unit as claimed in claim 9, wherein said frame has a hole defined in the central portion thereof, and wherein said frame is secured to said valve body by a screw provided in said hole of said frame.

11. An electromagnetic valve unit as claimed in claim 10, wherein said cover has a plurality of engaging portions provided on the outer side surface of said cover, and said frame has protrusions formed on the outer side surface of said frame, and wherein said engaging portions engage with said protrusions to secure said cover to said frame.

* * * * *